(12) United States Patent
Daamen et al.

(10) Patent No.: US 7,589,425 B2
(45) Date of Patent: Sep. 15, 2009

(54) METHOD OF MANUFACTURING A SEMICONDUCTOR DEVICE HAVING DAMASCENE STRUCTURES WITH AIR GAPS

(75) Inventors: Roel Daamen, Posterholt (NL); Greja Johanna Adriana Maria Verheijden, Valkenswaard (NL)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 336 days.

(21) Appl. No.: 11/084,081

(22) Filed: Mar. 17, 2005

(65) Prior Publication Data

US 2005/0221600 A1    Oct. 6, 2005

(30) Foreign Application Priority Data

Mar. 18, 2004 (EP) .................... 04101107

(51) Int. Cl.
*H01L 29/40* (2006.01)
*H01L 21/4763* (2006.01)
(52) U.S. Cl. .................... 257/774; 438/619
(58) Field of Classification Search ............ 438/619, 438/633, 639, 638, 305; 257/758, 750, 774; 359/360
See application file for complete search history.

(56) References Cited

U.S. PATENT DOCUMENTS

| | | | |
|---|---|---|---|
| 6,071,809 A | | 6/2000 | Zhao |
| 6,555,467 B2 * | | 4/2003 | Hsu et al. .................... 438/633 |
| 2002/0158337 A1 * | | 10/2002 | Babich et al. ................ 257/758 |
| 2005/0215047 A1 * | | 9/2005 | Daamen et al. ............. 438/619 |

FOREIGN PATENT DOCUMENTS

| WO | WO 02/19416 | 3/2002 |
|---|---|---|
| WO | WO 0219416 A1 * | 3/2002 |
| WO | WO 2004053948 A2 * | 6/2004 |

* cited by examiner

*Primary Examiner*—Richard A. Booth
(74) *Attorney, Agent, or Firm*—Knobbe Martens Olson & Bear, LLP (57) ABSTRACT

A method of manufacturing a semiconductor device having damascene structures with air gaps is provided. In one embodiment, the method comprises providing a substantially planar layer having a first metal layer, depositing a via level dielectric layer, patterning the via level dielectric layer, at least partly etching the via level dielectric layer, depositing a disposable layer on the at least partly etched via level dielectric layer, patterning the disposable layer, depositing a second metal layer, planarizing second metal layer, depositing permeable dielectric layer after planarizing the second metal layer, and removing the disposable layer through the permeable dielectric layer to form air gaps.

18 Claims, 5 Drawing Sheets

METHOD OF MANUFACTURING A SEMICONDUCTOR DEVICE HAVING DAMASCENE STRUCTURES WITH AIR GAPS

BACKGROUND OF THE INVENTION

1. Field of the Invention

The invention relates to a method of manufacturing a semiconductor device having damascene structures with air gaps as well as an accordingly manufactured semiconductor device.

2. Description of the Related Technology

The trend towards integrated circuits with deep submicron technology (i.e., involving feature sizes less than 0.35 microns) has increased the need for multi-layer interconnects. The performance of integrated circuits in the deep submicron regime is increasingly dependent on the communication delay, i.e. the delay time of electronic signals traveling between the millions of gates and transistors present on the typical integrated circuits. As a result, capacitance and resistance effects resulting from the passive interconnect structures are increasingly becoming important and do have to be well-controlled.

One way to solve the above problems is to use low resistance metals (e.g., copper) in conjunction with insulating materials with low dielectric constants ("low-k dielectrics") between metal lines. A low-k dielectric is a dielectric material, which exhibits a dielectric constant substantially less than conventional dielectric materials such as silicon dioxide.

Based on considerable efforts optical lithography techniques have been able to keep up with deep submicron requirements using techniques such as off-axis illumination, phase shifting masks, and other methods known in the art. However, the achieved increase in resolution is paid by a decrease in the depth of focus. Therefore, highly planar surfaces are required during intermediary process steps. To achieve highly planar surfaces, traditional metal deposition and photolithographic techniques become progressively more ineffective as line widths are scaled down and multiple layers of metal are used.

Chemical-Mechanical Polishing (CMP) is increasingly being used in the fabrication of interconnect layers for modern integrated circuits especially with more than three layers. The metal lines thereof usually comprise a high aspect ratio (e.g., lines in the order of 0.25 μm in width and in the order of 1.0 μm in height). For more detail on the CMP please refer to the introductory part of U.S. Pat. No. 6,071,809.

A typical semiconductor manufacturing technique based on the CMP techniques is the so-called damascene process. A damascene process comprises the steps of forming patterns in a dielectric layer, filling these patterns with an interconnect metal, removing the excess metal on the wafer surface by polishing and leaving inlaid interconnect metal features.

Basically two damascene processes exist, namely the single-damascene and the dual-damascene process. In a single damascene process, a lower conductor is formed on a substrate and is coated with a first dielectric layer. The lower conductor is contacted by patterning the first dielectric layer and forming a conductive plug in the first dielectric layer. Thereafter, a second dielectric layer deposited on the first dielectric layer is patterned and an interconnect wiring metallization is formed in the patterned second dielectric layer. In addition a dielectric is deposited, the structures are etched and the metal is filled and planarized resulting in in-laid metal structures. During the fabrication and the interconnecting using single damascene processing, every layer is done separately, i.e., a single damascene trench level followed by single damascene via level. However, in a dual-damascene process, the interconnect metal wiring and the conductive plug are formed by patterning both the via and the trench patterns into the first dielectric layer. Thereafter, the via and the trench are filled simultaneously with metal. The dual damascene process provides a simple and low cost manufacturing technique.

Copper is preferred over aluminum for interconnect metallization as its conductivity is relatively high, i.e., low resistance, and it is less susceptible to electro-migration failure than many other metals. On the other hand, the use of Cu as interconnect metal introduces new problems, since bringing copper in contact with silicon or silicon dioxide may lead to devastating results. This is because copper migrates or diffuses into the silicon dioxide increasing leakage currents or actually shorting-out adjacent conductors. Accordingly, some kind of Cu diffusion barriers around copper conductors must be introduced. In the above damascene structures, the inner surfaces (i.e., the bottom and sides of the via and trench) are typically coated with a thin layer of Ti, TiN, Ta, TaN, WN or another adequate barrier metal. The top surface of a Cu conductor is then typically capped with a layer of silicon nitride or another barrier material after the inlaid Cu conductors are formed by CMP. Silicon nitride, silicon carbide or silicon carbo nitride is typically used as it is an effective diffusion barrier for copper.

In U.S. Pat. No. 6,071,809 a typical prior art low-k dual-damascene structure is shown, which includes copper conductors formed on a substrate with a dielectric (e.g., silicon dioxide or a low-k dielectric). A nitride cap layer is formed on copper conductors, which is followed by a low-k dielectric layer, an etch stop silicon dioxide layer, a second low-k dielectric layer, and a hard mask silicon dioxide layer. Using standard etching techniques, vias and trenches are patterned in the low-k dielectrics, and the copper interconnect metal and any seed and barrier layers are deposited to form the connection to conductor. The cap layer typically consists of silicon nitride and hard mask layer typically consists of silicon dioxide.

Usually, advanced low-k materials have a bulk k-value of approximately 2, while air has a k-value of 1. Therefore, the use of air gaps instead of low-k materials would lead to a significant reduction of parasitic capacitance. One example of a damascene structure with air gaps is shown in WO 02/19416. A standard dual damascene structure is be manufactured as described in U.S. Pat. No. 6,071,809. Accordingly, the dual damascene structure comprises a metal layer, a first dielectric layer as via dielectric (low-k dielectrics such as siloxane or a polyarylene ether), a second dielectric layer (such as SOG, NanoglassTm or a polymer like SiLK) disposed on the first dielectric layer as trench level dielectric with an interconnect groove. In addition, an etch stopper layer (such as SiN) is present between the first dielectric layer and the second dielectric layer. Metal, preferably copper Cu, fills the via and the interconnect groove forming a metal line having an upper side. A barrier and the Cu seed layer is provided on the walls of the via and the interconnect groove before depositing the Cu. The second dielectric layer is removed so that the metal which has filled the interconnect grove at trench level is laid open, i.e. the second dielectric layer is used as a sacrificial layer for defining the metal lines. A non-conductive barrier layer (like silicon nitride or silicon carbide) is provided over the laid open metal line and the laid open etch stop layer. A disposable layer is deposited on the etch stop layer and the metal line. Thereafter, the disposable layer is planarized down to the upper side of the metal line. A porous dielectric layer is spun on the disposable layer, and the disposable layer is removed or decomposed through the porous dielectric layer in order to form air gaps. The air gaps are obtained through a curing and baking step possibly assisted with UV treatment.

The spin-on material of the porous dielectric layer comprises a polymer which can be volatilized or degraded to smaller molecules, like PMMA (polymethyl methacrylate), polystyrene, and polyvinyl alcohol. Alternatively, a UV photoresist may also be used as the basic material for the manufacture of air gaps, and a plasma CVD layer or a spin-on dielectric layer is used for the porous dielectric layer. The porous dielectric layer preferably comprises a low-k dielectric such as SiLK, provided in a spin coating process. A plasma CVD layer may also be used as the porous dielectric layer.

SUMMARY OF CERTAIN ASPECTS OF THE INVENTION

One aspect of the invention provides a more cost effective manufacturing of a semiconductor device with damascene structures and air gaps.

Another aspect of the invention provides a semiconductor device manufactured by the method.

In one embodiment, the method comprises: providing a substantially planar layer having a first metal layer, depositing a via level dielectric layer, patterning the via level dielectric layer, at least partly etching the via level dielectric layer, depositing disposable layer on the at least partly etched via level dielectric layer, patterning the disposable layer, depositing a second metal layer, planarizing second metal layer, depositing permeable dielectric layer after planarizing second metal layer, and removing the disposable layer through the permeable layer to form air gaps.

In one embodiment, the manufacturing method needs less processing steps to manufacture a semiconductor device with air gaps at trench level as compared to the method disclosed in U.S. Pat. No. 6,071,809 and WO 02/19416. Thus a more cost effective manufacturing process is achieved.

In one embodiment, the disposable layer is a photoresist layer or an organic polymer layer with a low mass. Hence, the disposable layer can be easily decomposed.

In another embodiment, the photoresist layer is spun on the at least partly etched via level dielectric layer forming an easy and well known deposition step.

In one embodiment, a further barrier layer is deposited after the planarizing of the second metal layer, whereby the first metal layer is fully encapsulated by a diffusion barrier layer preventing a migration of Cu atoms.

In one embodiment, the patterning and etching of the via level dielectric layer is adapted to provide additional via holes in the via level dielectric layer to provide metal dummy structures in the via level dielectric layer after the removing. These metal dummy structures improve the mechanical stability of the air gaps.

In one embodiment, a single CVD reactor is used for performing the heating to decompose the disposable layer and for depositing a trench dielectric layer thereafter. Thus the usage of a stand-alone oven for the decomposing of the disposable layer can be omitted decreasing the required amount of apparatus and increasing the throughput.

Another aspect of the invention provides a semiconductor device having damascene structures with air gaps comprising a substantially planar layer with a first metal layer, a patterned and at least partly etched via level dielectric layer on the first metal layer, a patterned disposable layer deposited on the at least partly etched via level dielectric layer, a planarized second metal layer, a permeable dielectric layer deposited on the planarized second metal layer, and at least one air gap formed by removing the disposable layer through the permeable dielectric layer.

BRIEF DESCRIPTION OF THE DRAWINGS

These and other aspects of the invention are apparent from and will be elucidated with reference to the embodiment(s) described hereinafter.

FIGS. 1 to 12 show a number of processing steps according to a method of manufacturing a semiconductor device in one embodiment.

DETAILED DESCRIPTION OF CERTAIN INVENTIVE EMBODIMENTS

Figure 1:
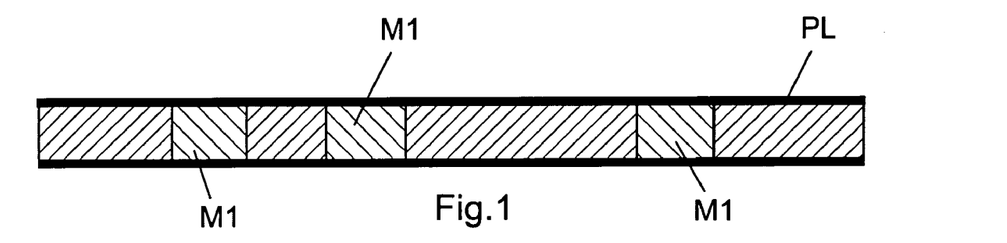
FIG. 1 shows a cross section of a semiconductor device according to one embodiment of the invention as starting point.

FIG. 1 shows a cross section of a semiconductor device as a starting point for the manufacturing process of a semiconductor device according to a first preferred embodiment of the invention. An alternative starting point may also be a single damascene metal 1 structure with air gaps. In particular, a first level metal interconnect layer M1 is shown with dielectric material in between and a passivation layer PL on top of the metal interconnect layer and the dielectric layer. The passivation layer PL is also used as diffusion barrier layer, i.e., as bottom hard mask and may be SiC, SiCN, Si3N4, a self-aligned electroless deposited barrier such as CoWP or CoWB.

Figure 2:
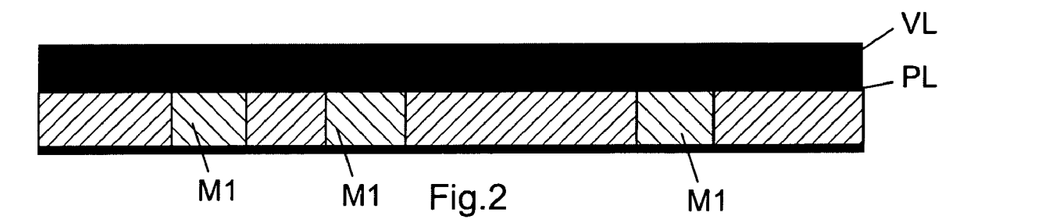
FIG. 2 shows a cross section of the device of FIG. 1 after a deposition of a via level dielectric.

FIG. 2 shows a cross section of the device of FIG. 1 after a deposition of a via level dielectric material VL. The via level dielectric material is deposited on the diffusion barrier layer PL either by spin coating the material or by chemical vapor deposition CVD. The via level dielectric material VL is preferably an oxide based material.

Figure 3:
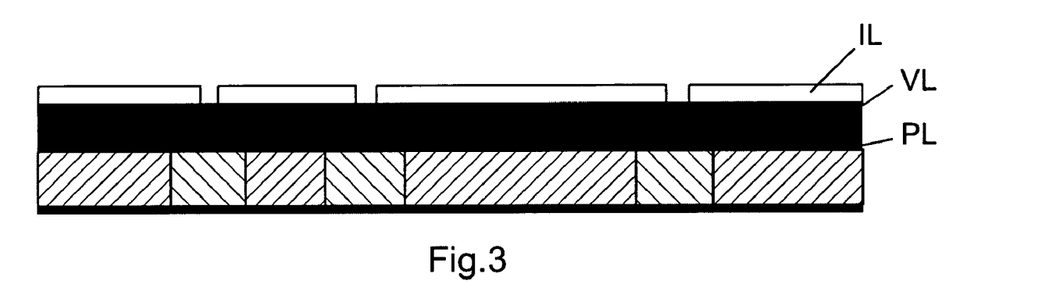
FIG. 3 shows a cross section of the device of FIG. 2 after patterning a deposited imaging layer/resist.

FIG. 3 shows a cross section of the device of FIG. 2 after patterning a deposited imaging layer/resist IL. An imaging layer/resist IL is deposited, preferably by spinning, on the via level dielectric VL and a lithography is performed to pattern the via level dielectric VL.

Figure 4A:
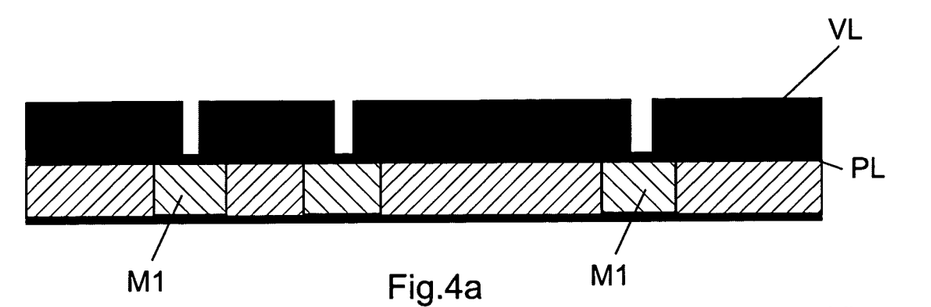
FIG. 4a shows a cross section of the device of FIG. 3 after etching the via in the dielectric layer and removing the imaging layer/resist.

FIG. 4a shows a cross section of the device of FIG. 3 after etching the imaging layer and the via level dielectric layer. Here, the via in the dielectric layer is etched down to the barrier layer PL at those areas which were not covered by the patterned imaging layer/resist IL. Accordingly, the respective vias are provided. This etching step can be performed by dry etching.

Figure 4B:
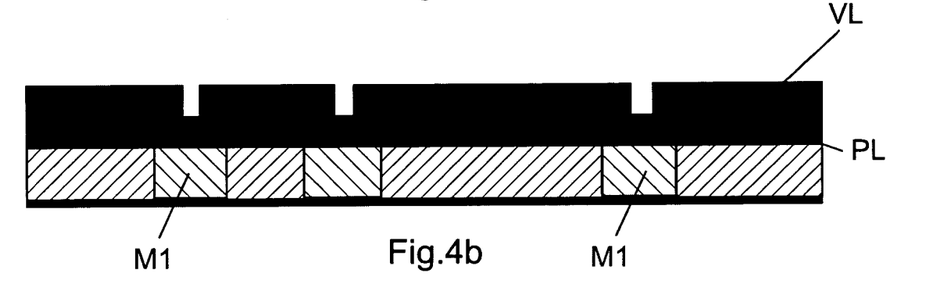
FIG. 4b shows a cross section of the device of FIG. 3 after partially etching the via in the dielectric layer and removing the imaging layer/resist.

FIG. 4b shows a cross section of the device after etching the imaging layer and partly etching the via level dielectric layer VL. Here, the imaging layer IL is completely removed and additionally the via level dielectric is only partly removed at those areas which were not covered by the patterned imaging layer IL. Accordingly, the respective vias are only partially etched and further processing is advantageously added. This removing step can be performed by dry etching.

Figure 5A:
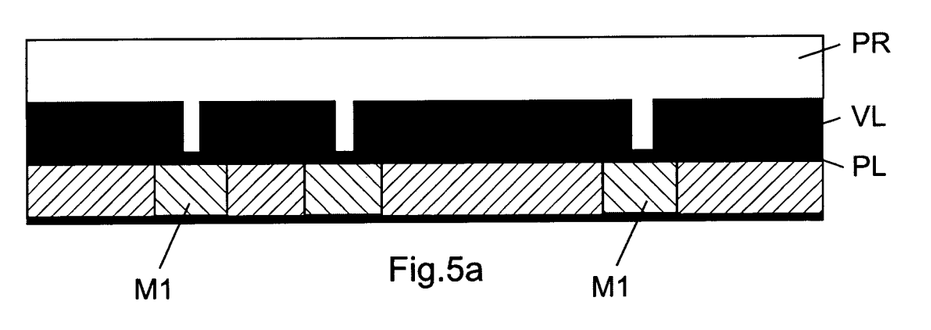
FIG. 5a shows a cross section of the device of FIG. 4a after spinning photoresist on the etched layers.
Figure 5B:
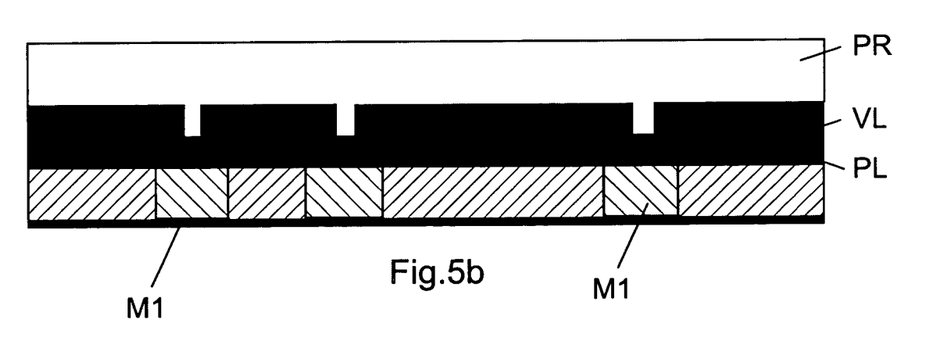
FIG. 5b shows a cross section of the device of FIG. 4b after spinning photoresist on the partly etched layers.

FIG. 5a and FIG. 5b show a cross section of the device after spinning photoresist PR on the etched layers of FIG. 4a and FIG. 4b, respectively. A standard resist PR is deposited onto the device of FIG. 4a or FIG. 4b. This may be done by spinning the resist onto the wafer filling the etched via holes. The photoresist layer constitutes the trench level dielectric material. Alternatively, the spin-on layer may also be an organic polymer with a low mass (i.e. a low amu), that decomposes at temperatures between 300° C. and 500° C., preferably between 350° C. and 450° C.

Figure 6A:
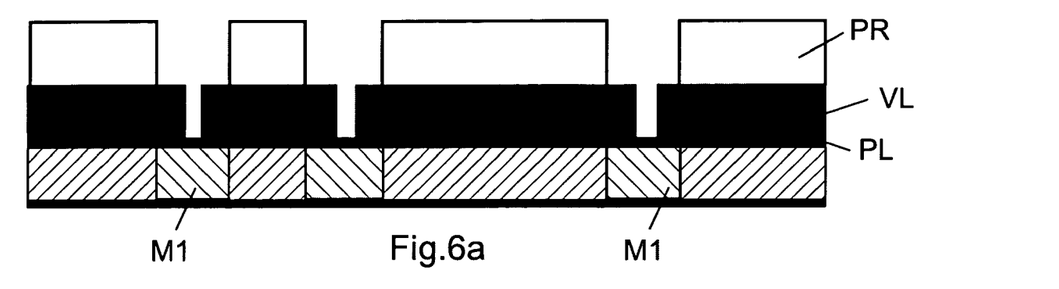
FIG. 6a shows a cross section of the device of FIG. 5a after patterning the photoresist.
Figure 6B:
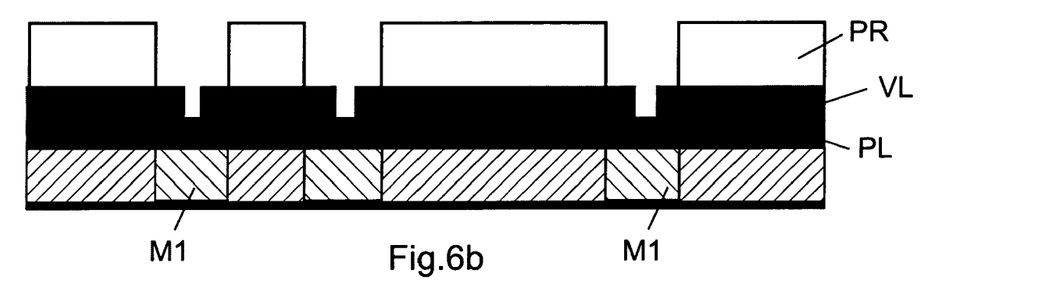
FIG. 6b shows a cross section of the device of FIG. 5b after patterning the photoresist.

FIG. 6a and FIG. 6b show a cross section of the device after patterning the photoresist of FIG. 5a and FIG. 5b, respectively. Here, the lithography for the trench level is performed on the via level dielectric VL which is covered with the resist.

Figure 7A:
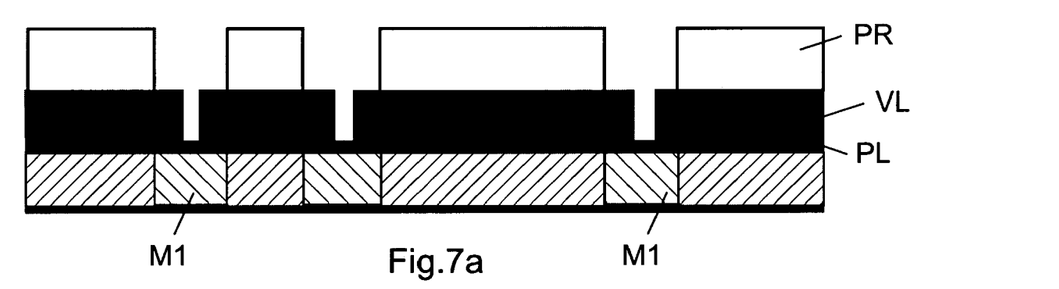
FIG. 7a shows a cross section of the device of FIG. 5a after patterning the photoresist which is ready for further processings.

FIG. 7a shows a cross section of the device after patterning the photoresist of FIG. 5a which is ready for further processing. The via holes are etched down to the diffusion barrier layer.

Figure 7B:
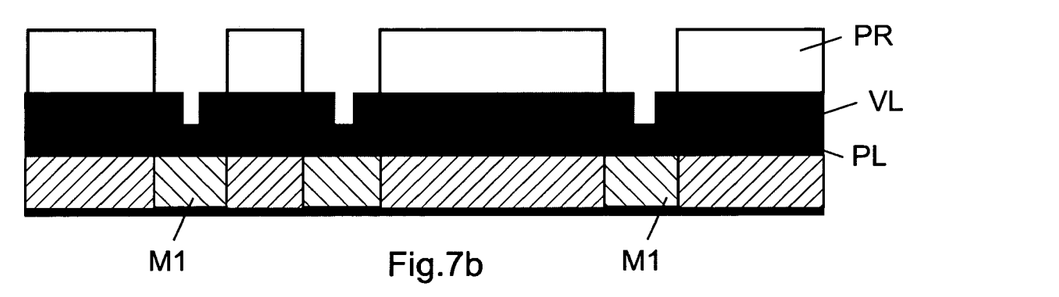
FIG. 7b shows a cross section of the device of FIG. 5b after a continued etching of the vias.

In FIG. 7b a cross section of the device of FIG. 5b after a continued etching of the vias is shown. After a further etching step, the via holes are fully etched down to the diffusion barrier layer as well. This etch step is performed by a selective etching leaving the resist unaffected, e.g., a standard oxygen etch may be used for organic exposed resist.

Figure 8:
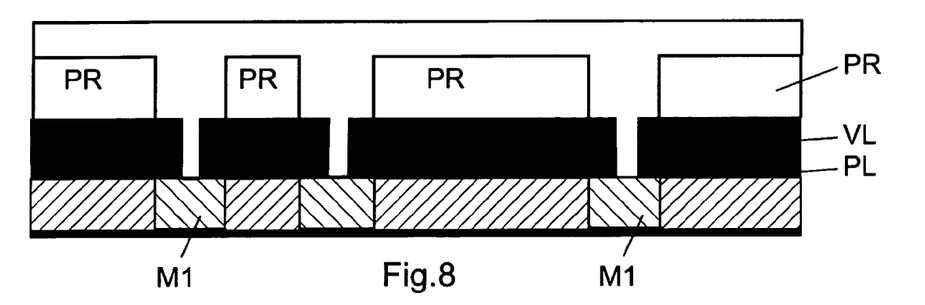
FIG. 8 shows a cross section of the device of FIGS. 7a or 7b after etching through a diffusion barrier layer on top of a first metal layer.

FIG. 8 shows a cross section of the device of FIGS. 7a or 7b after etching through a diffusion layer on top of a first metal layer. Here, a dry etch not attacking the resist is used, i.e., the bottom mask is opened without etching the resist on top of the via level dielectrics VL.

Figure 9:
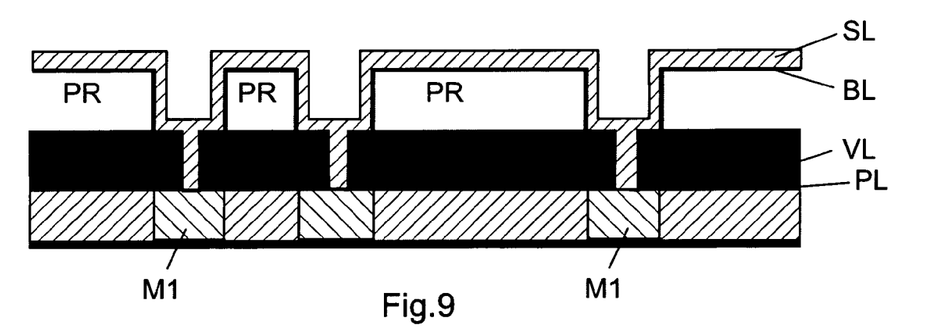
FIG. 9 shows a cross section of the device of FIG. 8 after a barrier layer deposition and a seed layer deposition.

FIG. 9 shows a cross section of the device of FIG. 8 after a barrier layer BL deposition and a seed layer SL deposition. The diffusion barrier layer BL deposition and the Cu seed layer SL deposition are performed by physical vapor deposition PVD or a CVD technique. The barrier layer BL may comprise Ta, TaN, Ti, TiN, WCN, or combinations thereof or any other suitable metallic diffusion barrier layer.

Figure 10:
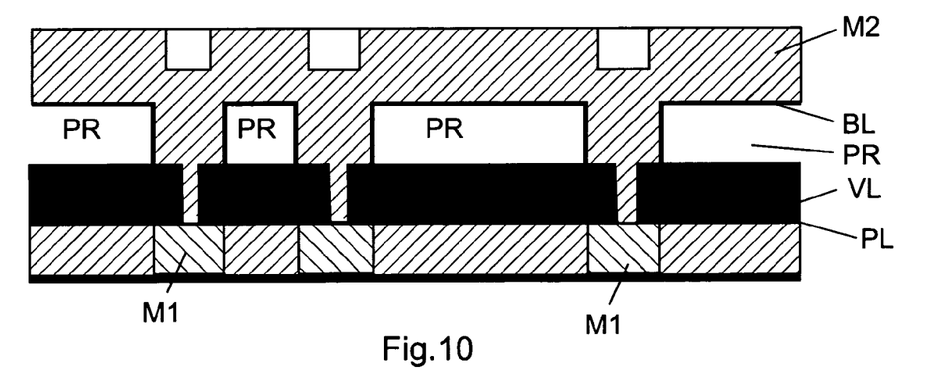
FIG. 10 shows a cross section of the device of FIG. 9 after a metal plating step.

FIG. 10 shows a cross section of the device of FIG. 9 after a copper plating step.

Figure 11:
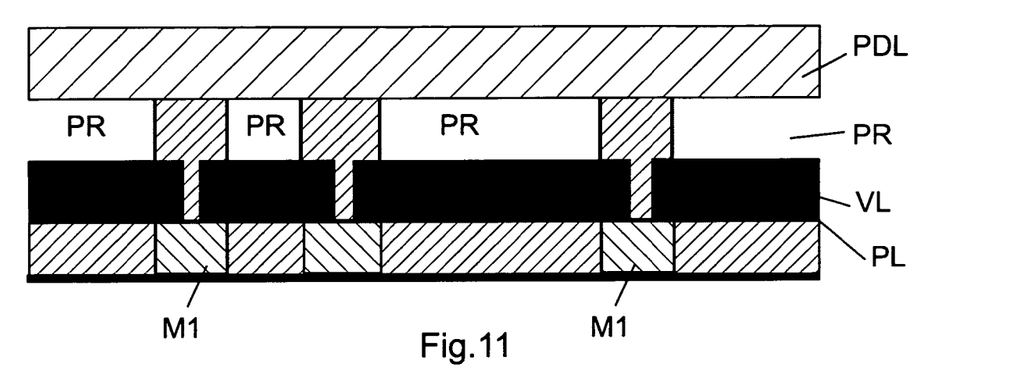
FIG. 11 shows a cross section of the device of FIG. 10 after a planarization step and a spinning on of a permeable dielectric layer.

FIG. 11 shows a cross section of the device of FIG. 10 after a planarization step and a spinning on of a permeable dielectric layer. The planarization of the copper is performed by Chemical-Mechanical Polishing CMP. Thereafter, a permeable dielectric material having a low-k value is spun onto the CMP treated surface.

Figure 12:
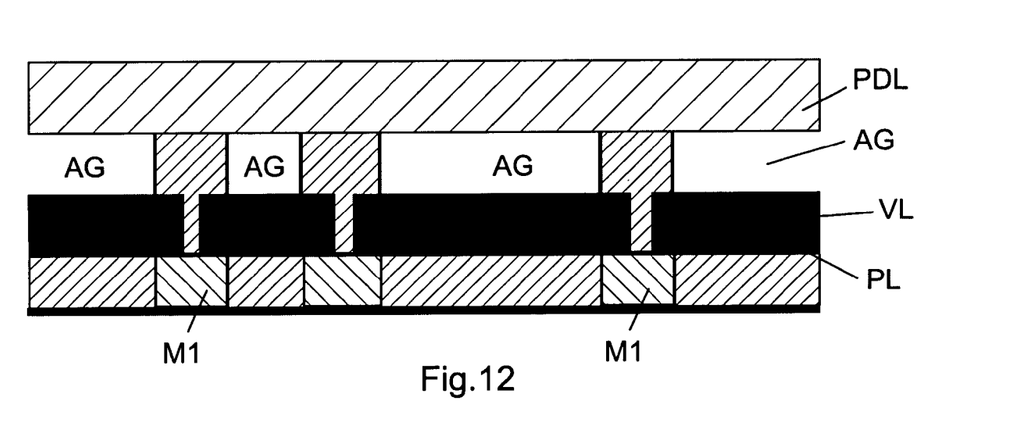
FIG. 12 shows a cross section of the device after decomposing the trench level photoresist.

FIG. 12 shows a cross section of the device after decomposing the trench level photoresist. The trench level resist which is used as sacrificial material is decomposed by heating the wafer. The trench level material decomposes and diffuses through the permeable dielectric material PDL. Finally, the air gaps AG are present in the volume previously occupied by the decomposed material PR.

The above mentioned semiconductor manufacturing process may be used in all CMOS, RFCMOS and BiCMOS processes.

Summarizing, the manufacturing process according the preferred embodiment is different from the technique used in WO 02/19416, where first a standard dual damascene structure is obtained and then the dielectric is removed, a diffusion barrier is deposited, resist is deposited, the resist is planarized, a porous dielectric is deposited and then the sacrificial material is decompose. Furthermore, the proposed technique is cheaper as multiple processing steps can be left out.

A semiconductor device manufactured as described above will be different from prior art semiconductor devices as an oxide(like) material will be present at the via-level with the air gaps at trench level. A following via-level on top of this structure is made out of a porous material. This already shows what technique has been used. Also here, due to the use of the sacrificial material there might be some very small amount of carbon-like material inside the air cavity, more precise at the tantalum interface protecting the copper. And last but not least, due to the technique that is used, especially the "via not fully etched until the bottom" one will see very smooth and rounded vias.

According to a second embodiment which is based on the first embodiment two further process steps are introduced after performing the CMP on the copper layer. In particular, a second barrier layer deposition is performed on the planarized copper layer M2 and the planarized photoresist layer PR. The deposited second barrier layer on top of the resist is removed using CMP leaving the second barrier layer on top of the copper layer substantially intact. The advantage of these further process step are that the copper metal lines and layers are completely encapsulated by a diffusion barrier layer preventing a migration of Cu atoms.

In other words a capping of the copper layer is performed before the depositing the permeable via-layer. However, also other capping methods may be implemented, like self-aligned electroless deposited barrier such as CoWP or CoWB and even a SiC/Si3N4 etc deposition followed by a lithography step and an etch step removing a liner from the top of the spacing, but leaving it on the copper thus capping/passivating this layer.

According to a third embodiment which may be based on the first or second embodiment metal dummies are introduced into the air gaps to increase the mechanical stability thereof. This may be achieved by adapting the lithography step as depicted in FIGS. 6a and 6b such that additional gaps are introduced into the resist layer. These additional gaps should be formed on top of the photoresist in between the trenches. Thereafter, the diffusion barrier layer deposition, the seed layer deposition and the subsequent processing steps as described according to the first or second embodiment are preformed. Since the additional gaps in the photoresist are arranged at positions in between the trenches and are filled with copper, the copper in the additional gaps is not interconnected with other metal lines and thus merely serves for increasing the stability of the air gaps.

According to a fourth embodiment, which may be based on the first, second or third embodiment, the throughput of the air gap formation process is increased by using the same CVD reactor for performing the heating step to decompose the disposable layer and for depositing the trench dielectric layer of a subsequent step. Preferably the heating is performed under an inert gas environment, like a nitrogen environment. Thus the usage of a stand-alone oven for the decomposing of the disposable layer can be omitted whereby decreasing the required amount of apparatus and increasing the throughput. In other words, only one CVD reactor is used for decomposing the sacrificial layer to form the air gap and for subsequently depositing a CVD trench level dielectric layer with a low k-value.

Alternatively to the photoresist used as disposable layer in the above embodiments any organic polymer with a low mass, i.e. low amu, that decomposes somewhere between about 300-500° C., preferably between about 350-450° C., may be chosen, as this layer will be decomposed.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of manufacturing a semiconductor device having damascene structures with air gaps, the method comprising:
    providing a substantially planar layer having a first metal layer;
    depositing a via level dielectric layer on the substantially planar layer;
    patterning the via level dielectric layer;
    at least partly etching the via level dielectric layer;
    depositing a disposable layer on the at least partly etched portion and the remaining non-etched portion of the via level dielectric layer;
    patterning the disposable layer;
    depositing a second metal layer on the via level dielectric layer and between the patterned portions of the disposable layer;
    planarizing the second metal layer;
    depositing a permeable dielectric layer on the planarized second metal layer and the patterned portions of the disposable layer; and
    removing the patterned portions of the disposable layer through the permeable dielectric layer so as to form air gaps.

2. The method according to claim 1, further comprising:
    depositing a barrier layer on the patterned disposable layer; and
    depositing a seed layer on the barrier layer.

3. The method according to claim 2, further comprising:
    depositing a further barrier layer on the planarized second metal layer.

4. The method according to claim 1, wherein the disposable layer is a photoresist layer or an organic polymer with a low mass.

5. The method according to claim 4, further comprising:
    spinning the photoresist layer on the at least partly etched via level dielectric layer.

6. The method according to claim 2, wherein the patterning and etching of the via level dielectric layer is adapted to form additional via holes in the via level dielectric layer to provide metal dummy structures in the via level dielectric layer after the removing the patterned portions of the disposable layer.

7. The method according to claim 3, wherein the patterning and etching of the via level dielectric layer is adapted to form additional via holes in the via level dielectric layer to provide metal dummy structures in the via level dielectric layer after the removing the patterned portions of the disposable layer.

8. The method according to claim 2, wherein a single CVD reactor is used for performing the removing by heating to decompose the patterned portions of the disposable layer and for depositing a trench dielectric layer thereafter.

9. The method according to claim 3, wherein a single CVD reactor is used for performing the removing by heating to decompose the patterned portions of the disposable layer and for depositing a trench dielectric layer thereafter.

10. A semiconductor device having damascene structures with air gaps, comprising:
    a substantially planar layer having a first metal layer;
    a patterned and at least partly etched via level dielectric layer formed on the substantially planar layer;
    a patterned disposable layer deposited on the at least partly etched portion and the remaining non-etched portion of the via level dielectric layer;
    a planarized second metal layer formed between the patterned portions of the disposable layer;
    a permeable dielectric layer formed on the planarized second metal layer and the patterned portions of the disposable layer; and
    at least one air gap formed by removing the patterned portions of the disposable layer through the permeable dielectric layer.

11. The semiconductor device of claim 10, further comprising a first barrier layer formed on the side portions of the second metal layer.

12. The semiconductor device of claim 11, wherein the first barrier layer comprises Ta, TaN, Ti, TiN, WCN, or combinations thereof or any other suitable metallic diffusion barrier layer.

13. The semiconductor device of claim 11, further comprising a second barrier layer formed on the top portion of the second metal layer.

14. The semiconductor device of claim 13, wherein the second barrier layer comprises Ta, TaN, Ti, TiN, WCN, or combinations thereof or any other suitable metallic diffusion barrier layer.

15. A method of manufacturing a semiconductor device having damascene structures with air gaps, the method comprising:

providing a substantially planar layer having a first metal layer;

depositing a via level dielectric layer on the substantially planar layer;

patterning the via level dielectric layer;

at least partly etching the via level dielectric layer;

depositing a disposable layer on the at least partly etched via level dielectric layer;

patterning the disposable layer;

depositing a second metal layer on the via level dielectric layer and between the patterned portions of the disposable layer;

planarizing the second metal layer;

depositing a permeable dielectric layer on the planarized second metal layer and the patterned portions of the disposable layer; and removing the patterned portions of the disposable layer through the permeable dielectric layer so as to form air gaps, wherein the method is used in processes to manufacture CMOS, RFCMOS and BiCMOS devices.

16. A method of manufacturing a semiconductor device having damascene structures with air gaps, the method comprising:

providing a substantially planar layer having a first metal layer;

depositing and at least partly etching a via level dielectric layer on the substantially planar layer;

forming a patterned disposable layer on the at least partly etched portion and the remaining non-etched portion of the via level dielectric layer;

forming a planarized second metal layer between the patterned portions of the disposable layer; and depositing a permeable dielectric layer on the patterned portions of the disposable layer and the second metal layer, wherein the patterned portions of the disposable layer are removed through the permeable layer, so as to form air gaps therein.

17. The method according to claim 1, wherein the depositing of the disposable layer is performed as a single procedure and wherein the same material is deposited on the at least partly etched portion and the remaining non-etched portion of the via level dielectric layer.

18. The method according to claim 16, wherein the depositing of the disposable layer is performed as a single procedure and wherein the same material is deposited on the at least partly etched portion and the remaining non-etched portion of the via level dielectric layer.

* * * * *

UNITED STATES PATENT AND TRADEMARK OFFICE
CERTIFICATE OF CORRECTION

PATENT NO. : 7,589,425 B2
APPLICATION NO. : 11/084081
DATED : September 15, 2009
INVENTOR(S) : Roel Daamen and Greja Johanna Adria Verheijden It is certified that error appears in the above-identified patent and that said Letters Patent is hereby corrected as shown below:

Column 1, Line 44, please delete "modem integrated circuits" and insert therefore, --modern integrated circuits--.

Column 2, Line 20, please delete "WN" and insert therefore, --WCN--.

Column 4, Line 65, please delete "Si3N4," and insert therefore, --$Si_3N_4$,--.

Column 6, Line 24, please delete "oxide(like)" and insert therefore, --oxide (like)--.

Column 6, Line 49, please delete "Si3N4" and insert therefore, --$Si_3N_4$--.

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,589,425 B2  Page 1 of 1
APPLICATION NO. : 11/084081
DATED : September 15, 2009
INVENTOR(S) : Daamen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 407 days.

Signed and Sealed this

Twenty-first Day of September, 2010

David J. Kappos
*Director of the United States Patent and Trademark Office*